United States Patent
Ku (10) Patent No.: US 8,917,163 B2
(45) Date of Patent: Dec. 23, 2014

(54) ACTIVE ELECTRONIC TAG APPARATUS FOR MEMORY CARD

(71) Applicant: Being Tech Electronics Corp., Hsinchu (TW)

(72) Inventor: Chiung-Ching Ku, Hsinchu County (TW)

(73) Assignee: Being Tech Electronics Corp., Hsinchu (TW)

( * ) Notice: Subject to any disclaimer, the term of this patent is extended or adjusted under 35 U.S.C. 154(b) by 115 days.

(21) Appl. No.: 13/769,391

(22) Filed: Feb. 18, 2013

(65) Prior Publication Data

US 2014/0159871 A1 Jun. 12, 2014

(30) Foreign Application Priority Data

Dec. 10, 2012 (CN) .......................... 2012 1 0525604

(51) Int. Cl.
*H04Q 5/22* (2006.01)
*G06K 7/10* (2006.01)
*G06K 19/07* (2006.01)

(52) U.S. Cl.
CPC ........ *G06K 7/10009* (2013.01); *G06K 19/0723* (2013.01)
USPC ... 340/10.4; 340/10.5; 340/572.1; 340/572.4; 340/572.7; 235/382; 235/385; 235/439; 235/492

(58) Field of Classification Search
CPC ....................... G06K 19/0722; G06K 7/10009
USPC .......... 340/10.4, 10.5, 572.1, 572.7; 235/382, 235/385, 439, 492
See application file for complete search history.

(56) References Cited

U.S. PATENT DOCUMENTS

| 7,692,585 B2 * | 4/2010 | Mohamadi .................... 342/368 |
| 8,292,175 B2 * | 10/2012 | Kim ............................. 235/439 |
| 2013/0257599 A1 * | 10/2013 | Tseng ......................... 340/10.5 |

* cited by examiner

*Primary Examiner* — Tai T Nguyen
(74) *Attorney, Agent, or Firm* — Winston Hsu; Scott Margo (57) ABSTRACT

An active electronic tag for a memory card is disclosed herein. The active electronic tag includes an antenna, a first amplifier, an automatic gain control circuit, a phase synchronization locking circuit, a decoding and TX/RX control unit and a second amplifier. The antenna receives a detecting signal transmitted from a card reader, in which the detecting signal is carried on a first carrier. The phase synchronization locking circuit generates a positive carrier and a negative carrier with a phase difference of 180 degree. The decoding and TX/RX control unit generates a response signal, which is carried on the negative carrier. By utilizing the phase difference of the first carrier and the negative carrier, the response signal cancels the first carrier on the card reader, so as to transmit the information saved inside the active electronic tag.

9 Claims, 4 Drawing Sheets

ACTIVE ELECTRONIC TAG APPARATUS FOR MEMORY CARD

BACKGROUND OF THE INVENTION

1. Field of the Invention

The present invention relates to an active electronic tag apparatus for a memory card and includes a structure and related modulation method of the active electronic tag apparatus.

2. Description of the Prior Art

With the development of wireless technology, an electronic tag, which includes a radio frequency circuit and is utilized for storing information, has been widely used, such as identification, an access control system or electronic money. A typical electronic tag is passive, which receives a detecting signal and a carrier transmitted from a card reader as a power source, and utilizes a coupling effect between antennas to change a voltage of the card reader by a load variation of the electronic tag, so as to transmit information.

Electronic products are required to be slim and light; however, the dimension of the electronic tag is difficult to be decreased due to the limitation of the antenna area of the electronic tag. The reason is that the antenna area of the electronic tag relates to the transmitting distance. When the antenna area of the electronic tag is reduced, the coupling coefficient between the antenna of the electronic tag and the antenna of the card reader is decreased. As a result, the load variation of the electronic tag is difficult to change the voltage of the card reader, and information of the electronic tag cannot be effectively transmitted to the card reader.

Thus, in order to effectively transmit information while minimizing the electronic tag, to meet various applications, there is an urgent need for improvement over the prior art.

SUMMARY OF THE INVENTION

An aspect of the present invention is to provide an active electronic tag to effectively transmit information even if the antenna area of the electronic tag is reduced, and to be suitable for a memory card or a device of small space.

An active electronic tag according to an embodiment of the present invention includes an antenna, a first amplifier, an automatic gain control circuit, a phase synchronization locking circuit, a decoding and TX/RX control unit, and a second amplifier. The antenna is utilized for receiving a detecting signal transmitted from a card reader, wherein the detecting signal is carried on a first carrier. The first amplifier is electrically coupled to the antenna for amplifying the detecting signal. The automatic gain control circuit is electrically coupled to the first amplifier and utilizing a feedback method to control the first amplifier to stably amplify the detecting signal. The phase synchronization locking circuit is electrically coupled to the first amplifier, and receiving the amplified detecting signal and a transmitting control signal to generate a positive carrier and a negative carrier. The decoding and TX/RX control unit is electrically coupled to the first amplifier and the phase synchronization locking circuit, receiving the amplified detecting signal, the positive carrier and the negative carrier, detecting the detecting signal of the first carrier, and generating the transmitting control signal and a response signal according to the detecting signal of the first carrier, wherein the response signal is carried on the negative carrier. The second amplifier is electrically coupled to the decoding and TX/RX control unit and the antenna for amplifying the response signal to the antenna and transmitting the response signal to the card reader by the antenna, wherein the response signal utilizes a phase difference between the negative carrier and the first carrier to cancel the first carrier on the card reader, so as to transmit information.

According to another embodiment of the present invention, the phase synchronization locking circuit includes an oscillator, a frequency divider, a delay circuit, a positive phase selector, a negative phase selector, a phase comparator, and an up/down counter. The oscillator is utilized for generating an oscillator frequency. The frequency divider is utilized for dividing the oscillator frequency to generate an internal clock. The delay circuit is utilized for delaying the internal clock and generating a plurality of delay clocks, wherein the plurality of delay clocks have identical frequencies equal to a frequency of the internal clock and different phases. The positive phase selector and the negative phase selector are utilized for selecting and outputting a delay clock with a phase closest or secondarily closest to the phase of the first carrier from the plurality of delay clocks as the positive carrier, and for selecting and outputting a delay clock with a phase difference of 180 degrees comparing to the first carrier from the plurality of delay clocks as the negative carrier. The phase comparator compares the phase of the first carrier with the phase of the positive carrier, and controls the up/down counter to count up or down.

According to another embodiment of the present invention, the phase selection unit includes an up/down counter, a positive phase selector, a negative phase selector, and a phase comparator. The up/down counter adjusts the phase locking count according to an up counting signal or a down counting signal, wherein when the up/down counter receives the transmitting control signal, the up/down counter stops adjusting the phase locking count. The positive phase selector selects a delay clock from the plurality of delay clocks as the positive carrier according to the phase locking count. The negative phase selector selects a delay clock from the plurality of delay clocks as the negative carrier according to the phase locking count. The phase comparator is utilized for comparing the first carrier with the positive carrier, and respectively generating the up counting signal and the down counting signal according to a comparing result.

According to another embodiment of the present invention, the decoding and TX/RX control unit includes a decoding circuit, a transmitting switch, a one-out-of-two switch, and a microcontroller containing tag memory. The decoding circuit determines weather the card reader has an action of reading data. If the card reader has the action of reading data, the decoding circuit may notify the microcontroller containing tag memory to generate the transmitting control signal according to the tag memory information. The microcontroller containing tag memory receives the notification of the decoding circuit and may generate the transmitting control signal according to the tag memory information to control the one-out-of-two switch and the transmitting switch. The one-out-of-two switch is utilized for switching a driving clock provided to the decoding circuit to the positive carrier when the one-out-of-two switch receives the transmitting control signal, and switching the driving clock to the first carrier when the transmitting control signal is stopped. The transmitting switch receives the negative carrier and the transmitting control signal to generate the response signal to the second amplifier.

Another aspect of the present invention is to provide a signal modulation method of an active electronic tag to be adapted to an active electronic tag. According to an embodiment of the present invention, the active electronic tag includes a tag memory for storing tag information. The signal modulation method of the active electronic tag includes receiving a detecting signal transmitted from a card reader, wherein the detecting signal is carried on a first carrier; utilizing a feedback method to stably amplify the detecting signal; transmitting the detecting signal to a decoding circuit and utilizing the first carrier or a positive carrier as a driving clock of the decoding circuit, wherein the decoding circuit determines whether the card reader has a requirement of reading the tag memory and notifies a microcontroller containing tag memory to generate a transmitting control signal; generating the transmitting control signal and a response signal according to the positive carrier, the negative carrier, and the tag memory information when the microcontroller containing tag memory detects a notification of the decoding circuit, wherein the response signal is carried on the negative carrier; and amplifying the response signal and the negative carrier by the second amplifier and transmitting the amplified response signal to the card reader, wherein the response signal utilizes a phase difference between the negative carrier and the first carrier to cancel the first carrier on the card reader, so as to transmit the information.

According to another embodiment of the present invention, the phase difference between the negative carrier and the first carrier is between 158.34 degrees to 201.66 degrees.

According to another embodiment of the present invention, the step of generating the positive carrier and the negative carrier includes generating the oscillator frequency; dividing the oscillator frequency to generate an internal clock; delaying the internal clock and generating a plurality of delay clocks by the delay circuit, wherein the plurality of delay clocks have identical frequencies equal to a frequency of the internal clock and different phases; selecting a delay clock with a phase closest or secondarily closest to a phase of the first carrier from the plurality of delay clocks as the positive carrier, wherein the positive carrier has a corresponding phase locking count; and selecting the negative carrier with a phase difference of 180 degrees comparing to the first carrier from the plurality of delay clocks according to the phase locking count to control the response signal carried on the negative carrier to cancel the first carrier on the card reader.

According to another embodiment of the present invention, the step of selecting and outputting the delay clock with the phase closest or secondarily closest to the phase of the first carrier as the positive carrier includes comparing the first carrier with the positive carrier by the up/down counter, and respectively generating the up counting signal and the down counting signal according to a comparing result; and adjusting the phase locking count according to the up counting signal and the down counting signal, wherein when the transmitting control signal is generated, the phase locking count stops being adjusted, and selecting the delay clock from the plurality of delay clocks as the positive carrier according to the phase locking count.

According to another embodiment of the present invention, the step of generating the response signal and the transmitting control signal includes detecting the detecting signal of the first carrier by the decoding circuit to notify the microcontroller containing tag memory according to the variation of the detecting signal to generate the transmitting control signal according to the tag memory information; switching the driving clock inputted to the decoding circuit as the positive carrier according to the transmitting control signal; and inputting the negative carrier and the transmitting control signal simultaneously to a transmitting switch to generate the response signal.

In summary, applying to the embodiment of the present invention, the active electronic tag transmits the information of the active electronic tag by transmitting the response signal to cancel the first carrier on the card reader. Therefore, when dimension or area of the antenna of the active electronic tag is reduced and the coupling coefficient with the antenna of the card reader is lowered, the response signal may be amplified through the second amplifier to effectively transmit the tag information.

Besides, the phase synchronization locking circuit may rapidly generate the positive carrier with a phase identical to the first carrier and the negative carrier with a phase inverting to the first carrier. The positive carrier is utilized for stabilizing the driving clock of the decoding circuit, and the negative carrier may effectively cancel the first carrier by the response signal. By the above embodiment, the area of the active electronic tag may be reduced, and the transmitting distance of the active electronic tag may be increased, such that the application of the active electronic tag is more wide and suitable for the application of the memory card.

These and other objectives of the present invention will no doubt become obvious to those of ordinary skill in the art after reading the following detailed description of the preferred embodiment that is illustrated in the various figures and drawings.

DETAILED DESCRIPTION

In order to make the description of the present invention more detail and complete, the figures and the following various embodiments may be referenced, and the components with the same number in the figures represent the same or similar components. On the other hand, the well-known components and steps are not described in the embodiments to avoid resulting in unnecessary limitations to the present invention.

An active electronic tag provided by an embodiment of the present invention is utilized for solving the problem that the information of the active electronic tag may not be effectively transmitted when dimension or area of an antenna is reduced. Since the active electronic tag cancels a carrier on a card reader by transmitting a response signal to the card reader, when the dimension or area of the antenna is reduced, the response signal may be enhanced through an amplifier.

Additionally, in order to utilize the response signal to cancel the carrier on the card reader, the active electronic tag further utilizes an oscillator, a frequency divider, and a delay circuit to generate clock signals with a phase identical to and inverting to the carrier on the card reader. The clock signal with the inverting phase is utilized for transmitting the response signal, and the clock signal with the identical phase is utilized for maintaining the system stability of the active electronic tag and for a requirement of a decoding circuit when the response signal is transmitted.

Figure 1:
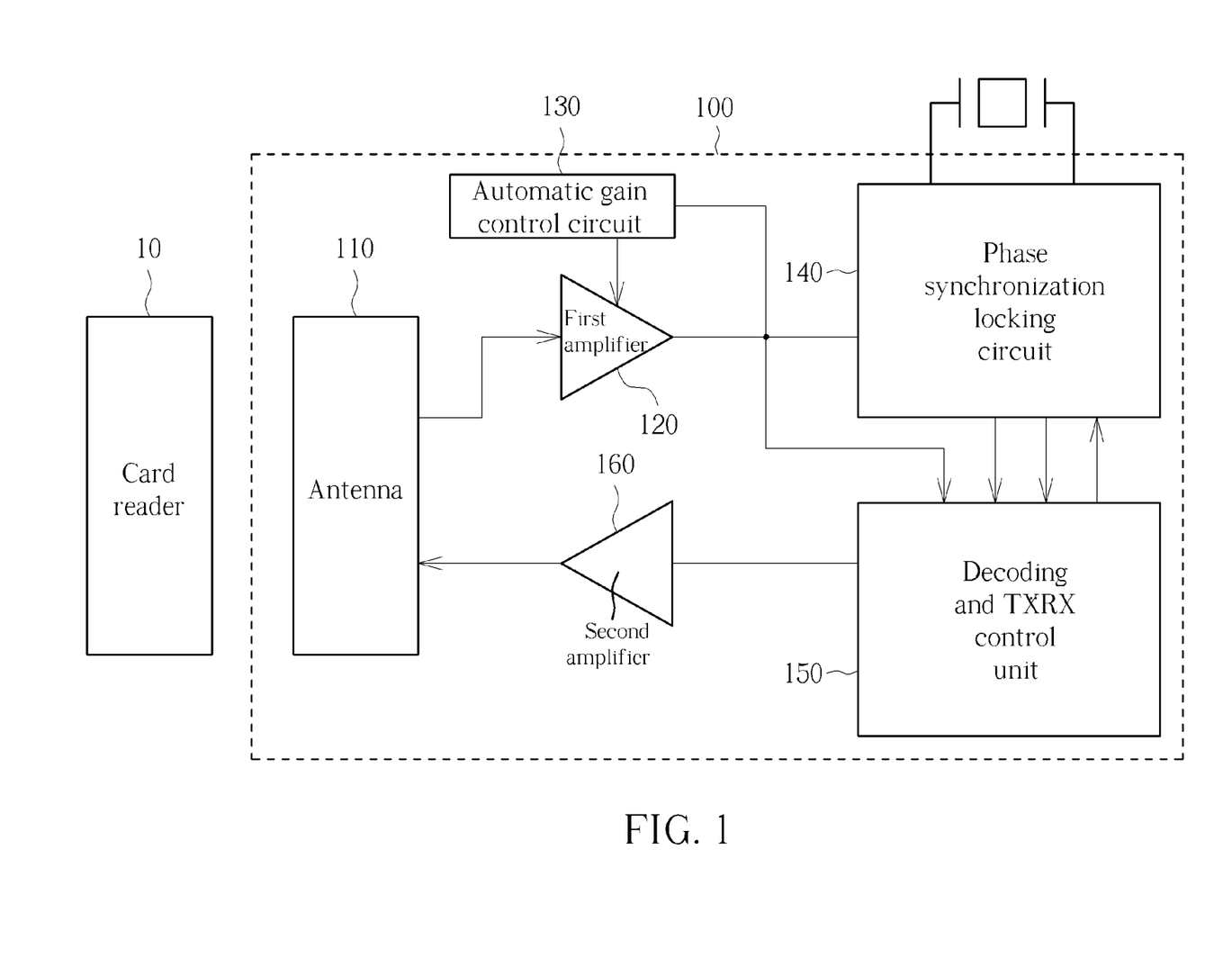
FIG. 1 illustrates a schematic diagram of circuit blocks of an active electronic tag according to a first embodiment of the disclosure.

As shown in FIG. 1, the active electronic tag 100 includes an antenna 110, a first amplifier 120, an automatic gain control circuit 130, a phase synchronization locking circuit 140, a decoding and TX/RX control unit 150, and a second amplifier 160. The first amplifier 120 is electrically coupled to the antenna 110. The automatic gain control circuit 130 is electrically coupled to the first amplifier 120. The phase synchronization locking circuit 140 is electrically coupled to the first amplifier 120 and the automatic gain control circuit 130. The decoding and TX/RX control unit 150 is electrically coupled to the first amplifier 120, the automatic gain control circuit 130 and the phase synchronization locking circuit 140. The phase synchronization locking circuit 140 is electrically coupled to the decoding and TX/RX control unit 150. The second amplifier 160 is electrically coupled to the decoding and TX/RX control unit 150 and the antenna 110. For example, the antenna 110 may be a planar loop antenna, the first amplifier 120 may be a low-noise amplifier, and the second amplifier 160 may be a power amplifier. In addition, the automatic gain control circuit 130, the phase synchronization locking circuit 140, and the decoding and TX/RX control unit 150 may be implemented by hardware circuits and/or software.

As to the operations of the active electronic tag 100, when the active electronic tag 100 is close to the card reader 10, the antenna 110 is utilized for receiving a detecting signal transmitted from the card reader 10 and the detecting signal carried on a first carrier is transmitted. Because of the effect of the distance or the transmission channel, the detecting signal received by the antenna 110 may be weak or unstable. Therefore, the first amplifier 120 is utilized for amplifying the detecting signal and the automatic gain control circuit 130 utilizes a feedback method to maintain the detecting signal amplified by the first amplifier 120 to be stable. The phase synchronization locking circuit 140 is utilized for receiving the amplified detecting signal and a transmitting control signal to generate a positive carrier and a negative carrier, wherein the negative carrier has the phase inverting to the first carrier on the card reader and the positive carrier has the phase identical to the first carrier. The decoding and TX/RX control unit 150 receives the amplified detecting signal, the positive carrier, and the negative carrier. The first carrier or the positive carrier is provided as a driving clock of the decoding and TX/RX control unit 150. The decoding and TX/RX control unit 150 determines the detecting signal of the first carrier, and if the determining result meets a specified rule or specification, the decoding and TX/RX control unit 150 generates the transmitting control signal and the response signal according to tag memory data, and switches the driving clock provided to the decoding and TX/RX control unit 150 to the positive carrier, wherein the response signal is carried on the negative carrier. The second amplifier 160 is utilized for amplifying the response signal to the antenna 110 and transmitting the response signal to the card reader 10 by the antenna 110, wherein the response signal utilizes a phase difference between the negative carrier and the first carrier to cancel the first carrier on the card reader 10, so as to transmit information.

In the embodiment, the amplifiers 120, 160 may increase the transmitting distance of the detecting signal or the response signal and effectively transmit the data. In addition, the positive carrier and the negative carrier generated by the phase synchronization locking circuit 140 are from the oscillator, and are immune from signal or channel interference. The frequencies of the positive carrier and the negative carrier are identical and equal to the frequency of the first carrier. The negative carrier has the phase inverting to the first carrier, and may be utilized to cancel the first carrier. Since the positive carrier has the phase identical to the first carrier, when the active electronic tag 100 transmits the response signal, the positive carrier is utilized for replacing the first carrier as the driving clock of the decoding and TX/RX control unit 150 to avoid the system instability caused by the first carrier, which is interfered by the response signal.

Noticeably, in the embodiment, the frequency of the first carrier is as 13.56 MHz, and the actual frequency may also be 125 kHz or other frequency and is not limited to the frequency of the above embodiment. In addition, the detecting signal and the response signal may be taken as on/off keying via the modified Miller coding, and then be transmitted via the first carrier and the negative carrier, which is not limited thereto.

Figure 2:
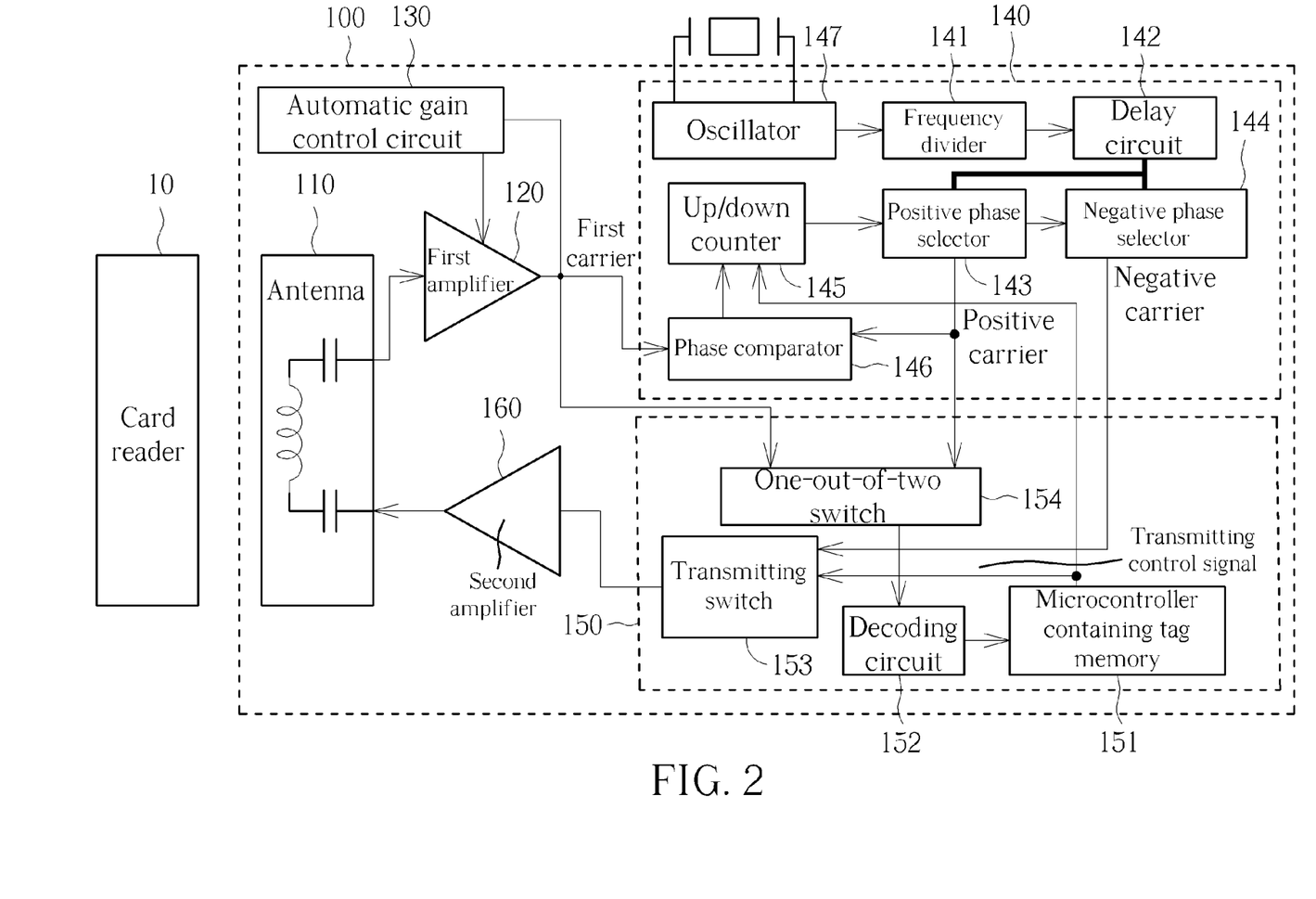
FIG. 2 illustrates a schematic diagram of circuit blocks of the active electronic tag in FIG. 1 according to the disclosure.

FIG. 2 illustrates a schematic diagram of a circuit block of the active electronic tag in FIG. 1 according to an embodiment of the present invention. The phase synchronization locking circuit 140 includes a frequency divider 141, a delay circuit 142, a positive phase selector 143, a negative phase selector 144, an up/down counter 145, an oscillator 147 and a phase comparator 146. The frequency divider 141 is electrically coupled to the oscillator 147. The delay circuit 142 is electrically coupled to the frequency divider 141, the positive phase selector 143 and the negative phase selector 144. The phase comparator 146 is electrically coupled to the first amplifier 120, the automatic gain control circuit 130, the positive phase selector 143, the negative phase selector 144, and the up/down counter 145.

As to functionalities, since the active electronic tag 100 may be applied to the near-field communication, the phase synchronization locking circuit 140 is required to immediately generate the positive carrier with a phase identical to the first carrier and the negative carrier with a phase inverting to the first carrier, such that the system can operate successfully. The oscillator 147 is utilized for generating an oscillator frequency. The frequency divider 141 is utilized for dividing the oscillator frequency to generate an internal clock. In the embodiment, the oscillator 147 may be a crystal oscillator, and the oscillator frequency is determined by an external crystal. Since the crystal frequency is inversely proportional to its volume, a smaller volume crystal may be selected to generate a higher frequency, such as 54.24 MHz, and then the frequency divider 141 is utilized to divide the higher frequency by 4 to obtain a system frequency of 13.56. The delay circuit 142 is utilized for delaying the internal clock and generating a plurality of delay clocks, wherein the plurality of delay clocks have identical frequencies equal to a frequency of the internal clock and different phases. The positive phase selector 143 and the negative phase selector 144 have a phase locking count, utilized for selecting and outputting a delay clock a delay clock with a phase closest or secondarily closest to the phase of the first carrier from the plurality of delay clocks as the positive carrier and the negative carrier. It is worth mentioning that the form of the above oscillator 147, the generated frequency of the oscillator 147, the dividing multiple of the frequency divider 141, and the quantity of the delay clocks are all examples, and are not limited to the above embodiment.

In the above embodiment, the active electronic tag 100 may generate the plurality of delay clocks with the identical frequencies and the different phases within a period of the system frequency by utilizing the delay circuit 142, and rapidly generate the positive carrier and the negative carrier through the selection of the positive phase selector 143 and the negative phase selector 144. Therefore, the active electronic tag 100 may immediately respond to the detecting signal of the card reader 10. In the embodiment, the positive phase selector 143 is utilized for selecting a delay clock from the plurality of delay clocks as the positive carrier, such that the positive carrier has the phase identical to the first carrier and is provided as the driving clock of the decoding and TX/RX control unit 150 when the response signal is transmitted.

The frequency divider 141 is electrically coupled to the oscillator 147. The delay circuit 142 is electrically coupled to the frequency divider 141, the positive phase selector 143 and the negative phase selector 144. The phase comparator 146 is electrically coupled to the first amplifier 120, the automatic gain control circuit 130, the positive phase selector 143, the negative phase selector 144, and the up/down counter 145. The positive phase selector 143 and the negative phase selector 144 are electrically coupled to the delay circuit 142, the up/down counter 145, and the decoding and TX/RX control unit 150. The phase comparator 146 is electrically coupled to the first amplifier 120, the automatic gain control circuit 130, the positive phase selector 143, the negative phase selector 144, and the up/down counter 145.

As to functionalities, the positive phase selector 143 is utilized for selecting a delay clock from the plurality of delay clocks as the positive carrier. The up/down counter 145 stores the phase locking count and adjusts the phase locking count according to an up counting signal or a down counting signal from the phase comparator 146. When the up/down counter 145 receives the transmitting control signal, the up/down counter 145 stops adjusting the phase locking count. The positive phase selector 143 selects a delay clock from the plurality of delay clocks as the positive carrier according to the phase locking count. The phase comparator 146 is utilized for comparing the first carrier with the positive carrier outputted from the positive phase selector 143 and respectively generating the up counting signal and the down counting signal according to a comparing result to transmit to the up/down counter 145.

Through the above operations, the positive carrier finally may change between the delay clocks with the phase closest and secondarily closest to the phase of the first carrier. Therefore, when the active electronic tag 100 transmits the response signal, the up/down counter 145 receives the transmitting control signal generated from the decoding and TX/RX control unit 150 and stops adjusting the phase locking count, and the positive carrier is the delay clock with the phase closest or secondarily closest to the phase of the first carrier.

In the embodiment, the decoding and TX/RX control unit 150 is responsible for controlling the transmitting state or the receiving state of the active electronic tag 100, and generates the response signal. The decoding and TX/RX control unit 150 includes a microcontroller 151 containing tag memory, a decoding circuit 152, a one-out-of-two switch 154, and a transmitting switch 153. The decoding circuit 152 is electrically coupled to the microcontroller 151 containing tag memory and the one-out-of-two switch 154. The one-out-of-two switch 154 is electrically coupled to the first amplifier 120, the automatic gain control circuit 130, the positive phase selector 143, and the decoding circuit 152. The transmitting switch 153 is electrically coupled to the negative phase selector 144 and the microcontroller 151 containing tag memory.

As to functionalities, the decoding circuit 152 is utilized for detecting the detecting signal of the first carrier and notifying the microcontroller containing tag memory to generate the transmitting control signal. When the up/down counter 145 receives the transmitting control signal, the up/down counter 145 stops adjusting the phase locking count and determines the positive carrier and the negative carrier. When the one-out-of-two switch 154 receives the transmitting control signal, the one-out-of-two switch 154 switches the driving clock provided to the decoding circuit 152 as the positive carrier. When the transmitting switch 153 receives the negative carrier and the transmitting control signal, the transmitting switch 153 generates the response signal to the second amplifier 160, and when the transmitting control signal is stopped, the up/down counter 145 continues adjusting and the one-out-of-two switch 154 switches the outputted driving clock as the first carrier.

Through the operations of the decoding and TX/RX control unit 150, when the decoding circuit 152 has detected that the microcontroller 151 containing tag memory starts to transmit the response signal, the positive carrier has stopped changing and may replace the first carrier to provide the stable driving clock to the decoding circuit 152. Noticeably, the decoding and TX/RX control unit 150 may be implemented by a circuit component, software, and/or a micro-processor, and is not limited herein.

In the embodiment, the response signal is finally amplified by the second amplifier 160 and is transmitted through the antenna 110 to the card reader 10. The first carrier on the card reader 10 is canceled by the response signal and results in a variation. The tag information of the active electronic tag 100 is transmitted to the card reader 10 by the variation.

Figure 3:
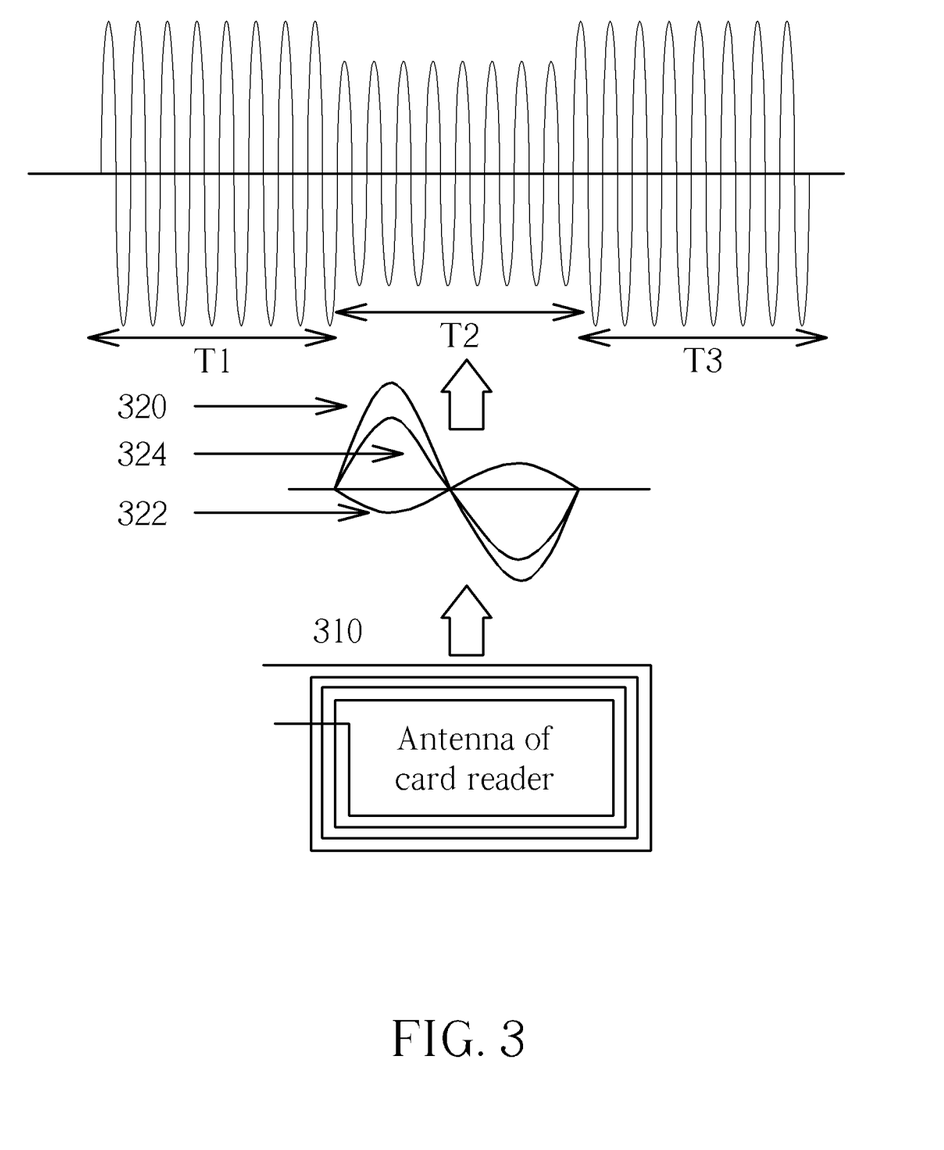
FIG. 3 illustrates a schematic diagram of a response signal cancelling a first carrier according to a first embodiment of the disclosure.

FIG. 3 illustrates a schematic diagram of the response signal cancelling the first carrier according to the first embodiment of the present invention. An antenna 310 of the card reader originally has the first carrier, such as the waveform 320. The active electronic tag 100 transmits the response signal, such as the waveform 322. When the antenna 310 of the card reader receives the response signal, the response signal is coupled with the first carrier. Since the first carrier has the phase inverting to the response signal, the response signal (the waveform 322) cancels part of the first carrier (the waveform 320) and the reading signal of the antenna of the card reader is generated, such as the waveform 324. During the T1 period, the card reader 310 does not receive the response signal or the response signal is low potential. Therefore, the reading signal of the antenna of the card reader is the first carrier. During the T2 period, the card reader 310 receives the response signal and the response signal is high potential. Therefore, the reading signal of the antenna of the card reader is the first carrier 320 subtracting the response signal 322. During the T3 period, the response signal is finished or the response signal is low potential. Therefore, the reading signal of the antenna of the card reader is the first carrier.

Figure 4:
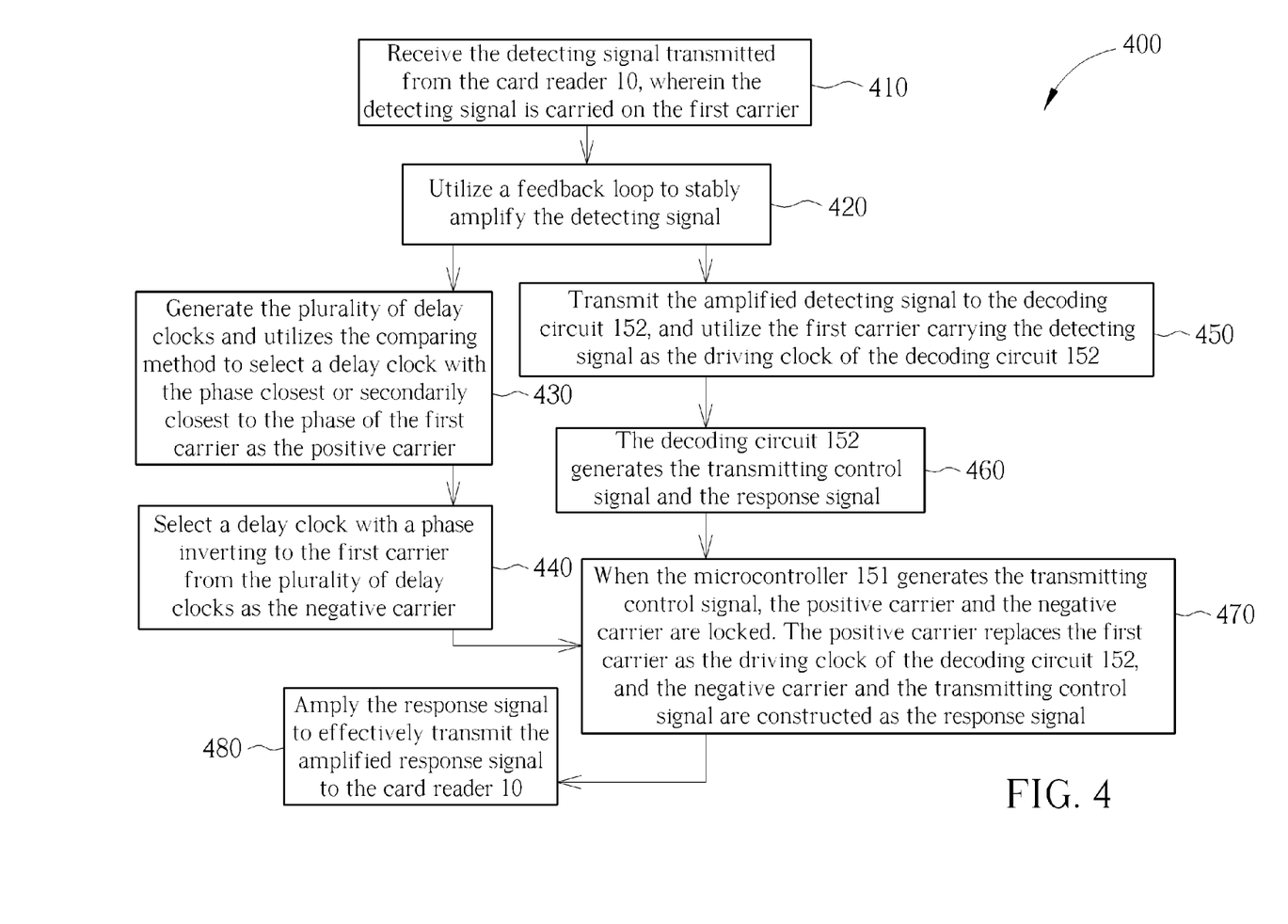
FIG. 4 illustrates a flowchart of a modulation method of an active electronic tag according to a second embodiment of the disclosure.

As shown in FIG. 4, the modulation method 400 of the active electronic tag includes the following steps:

Step 410: When the active electronic tag 100 is close to the card reader 10, the active electronic tag 100 receives the detecting signal transmitted from the card reader 10, wherein the detecting signal is carried on the first carrier.

Step 420: When the active electronic tag 100 receives the detecting signal, since the detecting signal may be weak or unstable, the amplifier utilizes a feedback loop to stably amplify the detecting signal and then transmits the amplified detecting signal to the inside of the active electronic tag 100.

Step 430: The active electronic tag 100 generates the plurality of delay clocks and utilizes the comparing method to select a delay clock with the phase closest or secondarily closest to the phase of the first carrier as the positive carrier, and the positive carrier is utilized for providing the stable clock to the decoding circuit 152 when the active electronic tag 100 transmits the response signal to the card reader 10.

Step 440: Select a delay clock with a phase inverting to the first carrier from the plurality of delay clocks as the negative carrier, wherein the negative carrier is utilized in the response signal to cancel the first carrier on the card reader 10.

Step 450: Transmit the amplified detecting signal to the decoding circuit 152, and utilize the first carrier carrying the detecting signal as the driving clock of the decoding circuit 152 to drive the decoding circuit 152.

Step 460: When the decoding circuit 152 is driven, the decoding circuit 152 notifies the microcontroller 151 containing tag memory to generate the transmitting control signal and the response signal according to the stored tag information.

Step 470: When the microcontroller 151 containing tag memory generates the transmitting control signal, the positive carrier and the negative carrier are locked. The positive carrier replaces the first carrier as the driving clock of the decoding circuit 152, and the negative carrier and the transmitting control signal are constructed as the response signal.

Step 480: Utilize the second amplifier 160 to amply the response signal to effectively transmit the amplified response signal to the card reader 10. Since the negative carrier has the phase inverting to the first carrier, the response signal may cancel the first carrier on the card reader 10 and the card reader 10 may determine whether the first carrier on the antenna is canceled to receive the transmitted information of the active electronic tag 100.

In the embodiment, the step 430 of selecting the delay clock with the phase closest to or secondarily closest to the phase of the first carrier as the positive carrier includes: generate the oscillator frequency, and divide the oscillator frequency to generate an internal clock with the frequency equal to the first carrier; delay the internal clock by a delaying loop to generate the plurality of delay clocks with different phases; select a delay clock from the plurality of delay clocks and compare the delay clock with the first carrier; generate the up counting signal and the down counting signal according to the comparing result to adjust the phase locking count; select another delay clock from the plurality of delay clocks according to the adjusted phase locking count to compare with the first carrier; and continue the above selection and comparison until the transmitting control signal is generated.

For example, the active electronic tag 100 generates 16 delay clocks, which have a first ranking delay clock with the delaying phase of 22.5 degrees and a second ranking delay clock with the delaying phase of 45 degrees. At this moment, if the phase locking count is 1, the first ranking delay clock is selected to compare with the first carrier. If the phase of the first ranking delay clock is faster than the first carrier, the phase locking count is added by 1 to become 2. On the contrary, the phase locking count is subtracted from 1 to become 0. Then, a delay clock is selected again according to the phase locking count to compare with the first carrier. After up to eight times of the comparisons, the corresponding delay clock of the phase locking count is the delay clock with the phase closest to or secondarily closest to the phase of the first carrier. The above method is only an example, and the present invention is not limited to the embodiment.

In the embodiment, the step 440 of selecting the delay clock with the phase inverting to the first carrier from the plurality of delay clocks as the negative carrier includes: input an offset adjusting parameter for compensating the phase shift of the signal during the transmitting process to generate the negative carrier with the phase inverting to the first carrier; summarize the offset adjusting parameter and the phase locking count to generate a negative carrier count; and the active electronic tag 100 may select the negative carrier with the phase inverting to the first carrier from the plurality of delay clocks according to the negative carrier count.

For example, the active electronic tag 100 generates the 16 delay clocks, which have a phase difference of 22.5 degrees between each delay clock. If the phase shifts of the signal during the transmitting process is 45 degrees, the offset adjusting parameter is 6 to represent the offset adjusting parameter totally adjusts 22.5×6=135 degrees, and the summarized phase of 180 degrees is the requirement of the negative carrier with the phase inverting to the first carrier. At this moment, if the phase locking count is 2, the negative carrier count is 2+6=8 to represent that the negative carrier may be the 8th ranking delay clock. The above method is only an example, and the present invention is not limited to the embodiment.

In the embodiment, the step 470 of locking the positive carrier and the negative carrier, switching the positive carrier as the driving clock of the decoding circuit 152, and constructing the response signal includes: when the transmitting control signal is generated, the phase locking count stops adjusting and the positive carrier and the negative carrier are locked; at this moment, the positive carrier and the negative carrier do not change again; then, the positive carrier is switched as the driving clock of the decoding circuit 152 according to the transmitting control signal; and the negative carrier and the transmitting control signal are simultaneously inputted to the transmitting switch to generate the response signal.

In summary, the embodiment of the present invention utilizes the response signal with the phase inverting to the carrier on the card reader to cancel the carrier on the card reader, so as to transmit the signal. The active method for transmitting signals may significantly narrow the antenna of the electronic tag, and maintain the signals to be effectively transmitted while the distance between the electronic tag and the card reader is increased, such that the electronic tag may be more widely used in different fields.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An active electronic tag, comprising:
an antenna, for receiving a detecting signal transmitted from a card reader, wherein the detecting signal is carried on a first carrier;
a first amplifier, electrically coupled to the antenna, for amplifying the detecting signal;
an automatic gain control circuit, electrically coupled to the first amplifier and utilizing a feedback method to control the first amplifier to stably amplify the detecting signal;
a phase synchronization locking circuit, electrically coupled to the first amplifier, and receiving the amplified detecting signal and a transmitting control signal to generate a positive carrier and a negative carrier;
a decoding and transmission/reception (TX/RX) control unit, electrically coupled to the first amplifier and the phase synchronization locking circuit, receiving the amplified detecting signal, the positive carrier and the negative carrier, detecting the detecting signal of the first carrier, and generating the transmitting control signal and a response signal according to the detecting signal of the first carrier, wherein the response signal is carried on the negative carrier; and
a second amplifier, electrically coupled to the decoding and TX/RX control unit and the antenna, for amplifying the response signal to the antenna and transmitting the response signal to the card reader by the antenna;

wherein the response signal utilizes a phase difference between the negative carrier and the first carrier to cancel the first carrier on the card reader, so as to transmit information;

wherein the decoding and TX/RX control unit comprises:
a decoding circuit, for detecting variation of the detecting signal of the first carrier, and controlling a microcontroller containing tag memory to generate the transmitting control signal according to the detecting signal;
a one-out-of-two switch, wherein when the one-out-of-two switch receives the transmitting control signal, a driving clock provided to the decoding circuit is switched to the positive carrier, and when the transmitting control signal is stopped, the driving clock is switched to the first carrier; and
a transmitting switch, receiving the negative carrier and the transmitting control signal to generate the response signal to the second amplifier.

2. The active electronic tag of claim 1, wherein the phase difference between the negative carrier and the first carrier is between 158.34 degrees to 201.66 degrees.

3. The active electronic tag of claim 1, wherein the phase synchronization locking circuit comprises:
an oscillator, for generating an oscillator frequency;
a frequency divider, for dividing the oscillator frequency to generate an internal clock;
a delay circuit, for delaying the internal clock and generating a plurality of delay clocks, wherein the plurality of delay clocks have identical frequencies equal to a frequency of the internal clock and different phases;
a positive phase selector, for selecting and outputting a delay clock with a phase closest or secondarily closest to the phase of the first carrier from the plurality of delay clocks as the positive carrier;
a negative phase selector, for selecting and outputting a delay clock with a phase difference of 180 degrees comparing to the first carrier from the plurality of delay clocks as the negative carrier; and
a phase comparator, comparing the phase of the first carrier with the phase of the positive carrier, and controlling a count of an up/down counter.

4. The active electronic tag of claim 3, wherein the phase selection unit comprises:
an up/down counter, adjusting the phase locking count according to an up counting signal or a down counting signal, wherein when the up/down counter receives the transmitting control signal, the up/down counter stops adjusting the phase locking count;
a positive phase selector, selecting a delay clock from the plurality of delay clocks as the positive carrier according to the phase locking count;
a negative phase selector, selecting a delay clock from the plurality of delay clocks as the negative carrier according to the phase locking count; and
a phase comparator, for comparing the first carrier with the positive carrier, and respectively generating the up counting signal and the down counting signal according to a comparing result.

5. A signal modulation method of an active electronic tag, adapted to an active electronic tag comprising a tag memory for storing tag information, the signal modulation method of the active electronic tag comprising:
receiving a detecting signal transmitted from a card reader, wherein the detecting signal is carried on a first carrier;
utilizing a feedback method to stably amplify the detecting signal;
transmitting the detecting signal to a decoding circuit and utilizing the first carrier or a positive carrier as a driving clock of the decoding circuit to drive the decoding circuit, wherein the decoding circuit detects the detecting signal of the first carrier and controls a microcontroller containing tag memory to generate a transmitting control signal;
generating the positive carrier and a negative carrier according to an oscillator frequency and the transmitting control signal;
generating the transmitting control signal and a response signal according to the positive carrier, the negative carrier, and the tag information when variation of the detecting signal of the first carrier is detected, wherein the response signal is carried on the negative carrier; and
amplifying the response signal and transmitting the amplified response signal to the card reader, wherein the response signal utilizes a phase difference between the negative carrier and the first carrier to cancel the first carrier on the card reader, so as to transmit the information;

wherein the step of generating the response signal and the transmitting control signal comprises:
detecting the first carrier and the detecting signal to notify the microcontroller containing tag memory to generate the transmitting control signal;
switching the driving clock inputted to the decoding circuit according to the transmitting control signal; and
inputting the negative carrier and the transmitting control signal simultaneously to a transmitting switch to generate the response signal.

6. The signal modulation method of the active electronic tag of claim 5, wherein the phase difference between the negative carrier and the first carrier is between 158.34 degrees to 201.66 degrees.

7. The signal modulation method of the active electronic tag of claim 5, wherein the step of generating the positive carrier and the negative carrier comprises:
generating the oscillator frequency;
dividing the oscillator frequency to generate an internal clock;
delaying the internal clock and generating a plurality of delay clocks, wherein the plurality of delay clocks have identical frequencies equal to a frequency of the internal clock and different phases;
selecting and outputting a delay clock with a phase closest or secondarily closest to a phase of the first carrier from the plurality of delay clocks as the positive carrier, wherein the positive carrier has a corresponding phase locking count; and
selecting the negative carrier from the plurality of delay clocks according to the phase locking count and an offset adjusting parameter, wherein the offset adjusting parameter is utilized for adjusting a phase of the negative carrier to control the response signal carried on the negative carrier to cancel the first carrier on the card reader.

8. The signal modulation method of the active electronic tag of claim 7, wherein the step of selecting and outputting the delay clock with the phase closest or secondarily closest to the phase of the first carrier as the positive carrier comprises:
adjusting the phase locking count according to an up counting signal and a down counting signal, wherein when the transmitting control signal is generated, the phase locking count stops being adjusted, and selecting the delay clock from the plurality of delay clocks as the positive carrier according to the phase locking count; and comparing the first carrier with the positive carrier, and respectively generating the up counting signal and the down counting signal according to a comparing result.

9. The signal modulation method of the active electronic tag of claim 7, wherein the step of selecting the negative carrier from the plurality of delay clocks comprises:
summarizing the phase locking count and the offset adjusting parameter to generate a negative carrier count; and
selecting a delay clock from the plurality of delay clocks as the negative carrier according to the negative carrier count.

* * * * *